United States Patent [19]

Sequin

[11] 4,056,737
[45] Nov. 1, 1977

[54] ANTI-ALIASING PRE-FILTER CIRCUIT FOR SEMICONDUCTOR CHARGE TRANSFER DEVICE

[75] Inventor: Carlo Heinrich Sequin, New Providence, N.J.

[73] Assignee: Bell Telephone Laboratories, Incorporated, Murray Hill, N.J.

[21] Appl. No.: 720,885

[22] Filed: Sept. 7, 1976

[51] Int. Cl.$^2$ .................. H03K 3/353; H03H 7/10; H01L 29/78
[52] U.S. Cl. .................... 307/304; 307/295; 333/70 T; 357/24
[58] Field of Search .......... 307/221 D, 304, 295; 333/70 A, 70 T; 357/24

[56] References Cited
U.S. PATENT DOCUMENTS

| 3,819,958 | 6/1974 | Gosney | 307/304 |
| 4,005,377 | 1/1977 | Engeler | 333/70 T |

OTHER PUBLICATIONS

"Parallel Realizations of Digital Interpolation Filters for Increasing Sampling Rate", by Urkowitz in IEEE Transactions, Circuits and Systems, vol. CAS-22 (Feb. 1975), pp. 146-154.
"A Computer Program for Designing Optimum Fir Linear Phase Digital Filters", by McClellen et al., IEEE Trans. on Audio and Electroacoustics, vol. AU-21, No. 6, pp. 506-526 (Dec. 1973).
"Transversal Filtering Using Charge-Transfer Devices", by Buss et al., IEEE Journal of Solid State Circuits, (Apr. 1973), pp. 138-146.

Primary Examiner—Stanley D. Miller, Jr.
Attorney, Agent, or Firm—D. Caplan

[57] ABSTRACT

An on-chip semiconductor pre-filter device is designed with a prescribed low frequency passband (0 to f) and a prescribed stopband (F±f), with a frequency roll-off therebetween. The pre-filter performs a weighted averaging of signal samples taken from an input electrical signal at a suitable sampling frequency and converts the weighted average into an equivalent charge packet for input by injection into a semiconductor charge coupled device (CCD) driven on the same chip by a clock of frequency F. In this way, the "reflected" parts (in band: F±f) of the frequency spectrum of the CCD are suppressed from the input to the CCD, thereby suppressing undesired aliasing in the CCD.

11 Claims, 9 Drawing Figures

ANTI-ALIASING PRE-FILTER CIRCUIT FOR SEMICONDUCTOR CHARGE TRANSFER DEVICE

FIELD OF THE INVENTION

This invention relates to the field of electrical signal filters, and more particularly to semiconductor signal filter apparatus.

BACKGROUND OF THE INVENTION

As known in the prior art, analog sampled data delay lines such as semiconductor charge transfer device delay lines, more particularly charge coupled devices (CCD), can be designed in various configurations for use as signal processors, such as transversal filters. A particularly useful form of a semiconductor transversal filter device is a low pass (baseband) transversal filter in a split electrode configuration, for use in voice communications. Typically, the passband in such a case is the range of frequencies from 0 to slightly less than 4 kHz, typically 3.2 kHz, that is, the range of the most useful portion of the human voice spectrum from the standpoint of communications. Such a CCD filter typically is driven by a clock pulse sequence of clock cycle frequency of 32 kHz. Accordingly, as known in the art, since this CCD transversal filter samples the incoming electrical signal to be filtered at a 32 sampling rate, it follows that this CCD filter will necessarily also pass all frequencies in the "reflection" portion of the spectrum, that is, in the range between 28 kHz(=32 kHz−4 kHz) and 36 kHz(=32 kHz+4 kHz). This phenomenon, called "aliasing", is undesirable in that it enables the passage of unwanted "reflection" frequencies through the CCD transversal filter.

Suppression of the above-described aliasing in a CCD signal processor can be accomplished by means of an auxiliary pre-filter, for example, an auxiliary CCD transversal pre-filter driven by a clock at 64 kHz, that is, just twice that of the low pass CCD filter, and designed to have a low pass baseband, typically 0 to 4 kHz, plus a stopband typically 28 kHz to 36 kHz, with frequency roll-off therebetween, that is, passing frequencies at or below 4 kHz and increasingly suppressing frequencies above 4 kHz, so that all frequencies in the band between 28 kHz and 36 kHz are virtually completely suppressed ("rejected" or "stopped"). However such an auxiliary CCD pre-filter would require a complete set of clock circuits, input circuits, and detection circuits, all operating at 64 kHz. This would make it economically unattractive, although it would have the advantage of scaling automatically with the clock frequency of the low pass CCD filter. On the other hand, although various arrangements of RC type pre-filters could be used for an auxiliary anti-aliasing filter, such arrangements tend to be complex and as costly as the low pass CCD filter itself. Accordingly, it would be desirable to have a relatively simple pre-filter device to suppress aliasing in a CCD delay line or, more generally, in a sampled data delay line which operates on analog sampled inputs. At the same time, it would be desirable that the frequency roll-off characteristic of this pre-filter device should scale with the operating ("driving") clock frequency of the CCD itself, so that the overall device (pre-filter plus CCD) can readily be used at different clock rates.

SUMMARY OF THE INVENTION

A pre-filter for a sampled data analog delay line, such as an anti-aliasing pre-filter for a semiconductor transversal filter CCD, is provided by means of a weighted averager or integrator of sampled signals of an analog input signal, the samples being taken at a rate equal to an integral multiple N of the delay line data transmission rate 1/T (driving clock frequency of the CCD), i.e., sampling rate S=N/T (where T = driving clock cycle period of CCD). Advantageously, each periodic summing interval (averaging period) P of each weighted averaging extends over a time interval of at least 2T, i.e., twice the period T of the sampled data delay line (P≧2T). Thus, for the illustrative case of an averaging period of P=2T, there will be averaged together just 2N samples per averaging period P. Moreover, in order to utilize the full data transmission capacity of the delay line, two (or more) similar branches, each containing similar sampler and weighted averagers, operate on the input in parallel, but out of phase, and alternate in feeding sampled data output as input for the sampled data delay line. By "out of phase" is meant that although each of the individual signal samples being processed for being fed into the different weighted averagers is originally the same for both branches, each weighted averager operates on a differently combined set of such samples, that is, over averaging periods which are mutually interleaved.

For example, for the case of four weighting factors $a_1$, $a_2$, $a_3$, $a_4$ (S=2/T, P=2T) for a sequence of samples $s_1$, $s_2$, $s_3$, $s_4$, $s_5$, $s_6$, $s_7$, $s_8$, etc., a first averager operates to form the weighted signal outputs (for inputs to the delay line) equal to: $S_1=(a_1s_1+a_2s_2+a_3s_3+a_4s_4)$, $S_3=(a_1s_5+a_2s_6+a_3s_7+a_4s_8)$, etc.; whereas a second averager operates one-half period P/2 (180°) out of phase to form signal outputs: $S_2=(a_1s_3+a_2s_4+a_3s_5+a_4s_6)$; $S_4=(a_1s_7+a_2s_8+a_3s_9+a_4s_{10})$, etc.; and these outputs are delivered as inputs to the delay line alternately, one from each averager: $S_1$, $S_2$, $S_3$, $S_4$, etc.

In a specific embodiment of the invention, a semiconductor transversal filter of the split electrode low pass baseband filter type of CCD with a clock period T is provided with an anti-aliasing pre-filter device. The prefilter includes means for sampling the analog signal input at a sampling rate S=2/T (or more). These samples are converted into corresponding charge packets in a pair of parallel branches A and B containing suitable semiconductor potential wells suitably controlled by electrodes, all advantageously integrated in the same semiconductor chip as the CCD. The desired weighting factors can be imparted to the charge packets in each branch by a number of potential wells of suitable relative (weighted) sizes, which meter out charge packets in accordance with (correspondingly weighted) signal samples and deliver the packets to a summing potential well in each branch for integrating these packets together. In the more general case of M parallel branches, these branches operate out of phase by 360°/M in weighting and summing together different groupings, typically of MN packets each, of these charge packets. Each such grouping is collected periodically over time intervals MT, in order to form output charge packets as inputs for the CCD. In this way, by suitably choosing the weighting factors, for example (1, 3, 3, 1) for the specific embodiment M=2, N=2, the pre-filter has a passband characteristic 0 to 1/8T, and a stopband characteristic 7/8T to 9/8T. Thus, for T=1/32 kHz, the resulting passband is 0 to 4 kHz and the resulting stopband is 28 to 36 kHz, just as desired for anti-aliasing in filtering of voice communications with the CCD.

If several samples, all weighted with the same weights are used in the integration process of forming a charge packet for injection into the CCD, then the same potential well can be used more than once per averaging period P in metering out the proper amount of charge to be added into the summing well. Thereby, further compactness of the pre-filter structure can be achieved.

BRIEF DESCRIPTION OF THE DRAWINGS

This invention together with its features, objects, and advantages can be better understood from the following detailed description when read in conjunction with the drawings in which.

DETAILED DESCRIPTION

Figure 1:
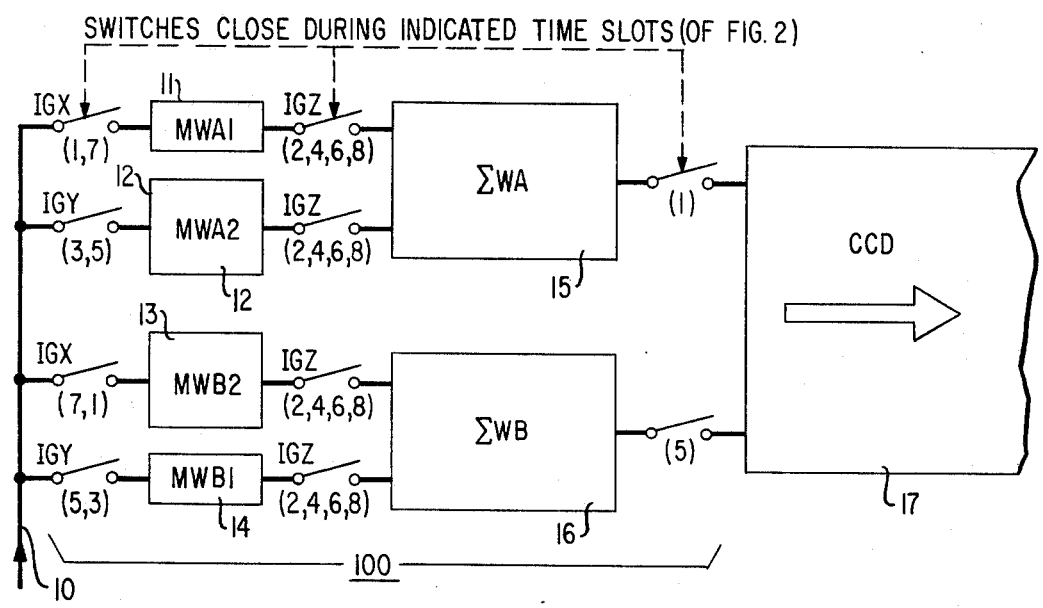
FIG. 1 is a block diagram of a pre-filter apparatus in accordance with a specific embodiment of the invention.

As shown in FIG. 1, a pre-filter 100 for suppressing undesired aliasing in a CCD delay line 17 is located between an input electrical signal line 10 and the CCD. The CCD is driven by a clock pulse train having a clock cycle frequency of 1/T, corresponding to a clock cycle period of T (FIG. 2), each clock cycle containing typically four pulses as provided by a master clock pulse source (not shown). The clock cycle frequency 1/T is typically 32 kHz, so that the CCD can receive for processing just one signal sample every 1/32 milliseconds, that is, at a sample input frequency equal to 1/T.

The pre-filter 100 includes a group of four semiconductor weighted metering potential wells 11, 12, 13, and 14, together with a pair of summing wells 15 and 16. The metering wells 11 and 12 together with the summing well 15 (and their switching interconnections) form a first branch A of the pre-filter 100, whereas the metering wells 13 and 14 together with the summing well 16 (and their switching interconnections) form a second branch B for operating in parallel with the first branch A. Curves A and B in FIG. 2 indicate the time slots and charge packet weighting factors suitable for sampling the input signal, and for delivering charge packets as input for the CCD 17 from the summing wells 15 and 16, respectively, to be described presently. All the wells are potential wells advantageously located at the surface of a single crystal silicon semiconductor body, the adjectives "metering" and "summing" being descriptive of the respective functions of the wells relative to the processing of charge packets. The metering wells 11, 12, 13, and 14 of the pre-filter device 100 (FIG. 2) are also labelled MWA1, MWA2, MWB2, MWB1, respectively, for purposes of comparison with the specific pre-filter device 200 shown in FIG. 3 which is described in greater detail below. Each input gate switch IGX enables charge packet production in the corresponding metering well 11 or 13 during time slots 1 and 7, whereas each input gate switch IGY enables charge packet flow into the corresponding metering well 12 or 14 during time slots 3 and 5. The metering wells 11, 12, 13, and 14 are geometrically substantially identical except that the equal areas of the wells 12 and 13 are both about three times the equal areas of the wells 11 and 14. Thus, for the same applied control voltage to these metering wells, charge packets are formed in the wells 12 and 13 of three times the size as those formed in the wells 11 and 14. The control voltage for the metering well 11 is supplied by taking a sample of the signal on an input line 10 during each of the time slots 1 and 7 (FIG. 2), as indicated in FIG. 1 by the switch IGX (1, 7). Typically, the duration of each sample time slot is about 3 microseconds, but in any event is smaller than T/4. Each of the charge packets thereby formed in the metering well 11 is linearly proportional (within an additive constant) to the signal sampled at the respective time slots 1 and 7; and each of these packets is emptied out of the metering well 11 and thereby transferred into the summing well 15 during the next succeeding time slot 2 or 8, respectively, as indicated by the input gate switch IGZ enabling charge flow during time slots 2, 4, 6, 8 on the output (right hand) side of the metering well 11. Similarly, the metering well 12 forms charge packets corresponding to the input signal on the signal line 10 sampled during time slots 3 and 5, and then delivers these charge packets during time slots 4 and 6, respectively, to the summing well 15 (also labelled ΣWA for later comparison with the device shown in FIG. 3). Thus, during each period P(=2T) of eight time slots, this summing well 15 receives and sums together four charge packets representing the four samples, equi-spaced in time, taken of the input signal on line 10. However, by virtue of the approximately 1 to 3 area ratio of the metering wells 11 and 12, the charge packets representing signal samples taken at time slots 3 and 5 will both be weighted by a factor of approximately 3 relative to the samples taken at time slots 1 and 7, as indicated by curve A in FIG. 2 (the "pulse" heights representing the weighting factors). At the very end of this period P (during the next succeeding time slot 1), the summing well 15 delivers the resulting weighted sum (or weighted average) charge packet to the CCD 17 for transfer and processing therein. This weighted sum charge packet thus has a charge content (within an additive constant) which is proportional to the correspondingly weighted sum of the previous four input signal samples.

At the same time that the summing well 15 of branch A thus periodically (with periodicity=P) delivers the weighted sum charge packet as input for the CCD 17, another summing well 16 of branch B also periodically delivers a similarly weighted sum charge packet but at times alternatingly with those of the summing well 15. This relative timing is indicated by curves A and B of FIG. 2. The summing well 16 is also labelled ΣWB for purposes of comparison with the pre-filter device 200 shown in FIG. 3. More specifically, metering wells 13 and 14 develop charge packets proportional to the samples taken of the input signal at time slots (7, 1) and (5, 3), respectively, with a relative weighting factor of approximately 3 to 1. The charge packet developed in the metering well 13 corresponding to the sample taken at time slot 7 is delivered to the summing well 16 during time slot 8, whereas the charge packet developed in this metering well 13 corresponding to the sample of time slot 1 is delivered to the summing well 16 during time slot 2. Similarly, the charge packet developed in the metering well 14 corresponding to the sample taken at time slot 5 is delivered to the summing well 16 during time slot 6, whereas the charge packet developed in this metering well 14 corresponding to the sample taken at time slot 3 is delivered to the summing well 16 during time slot 4. The weighted sum charge packet thus developed in the summing well 16 is delivered to the CCD 17 during the time slot 5. This sequence of signal sampling, charge packet weighting, and charge packet delivery to the CCD is indicated by curve B in FIG. 2. Thus, the pre-filter 100 delivers a charge packet from A or B to the CCD 17 at a combined rate equal to 1/T, that is, the clock rate of the CCD itself as is desired in a CCD.

It may be noted that the indicated closures of both of the switches IGZ, indicating transfer of charge packets from the metering wells and to the summing wells, during time slots 2 and 6 are superfluous; so that, instead of the set of switch IGZ closures during slots (2, 4, 6, 8), closures of IGZ during slots 4 and 8 would also be sufficient. In the specific embodiment described, a sequence of electrical pulses for charge transfer during slots (2, 4, 6, 8) was more readily electrically available than the sequence (4, 8), and thus the sequence (2, 4, 6, 8) was chosen for this embodiment.

Figure 2:
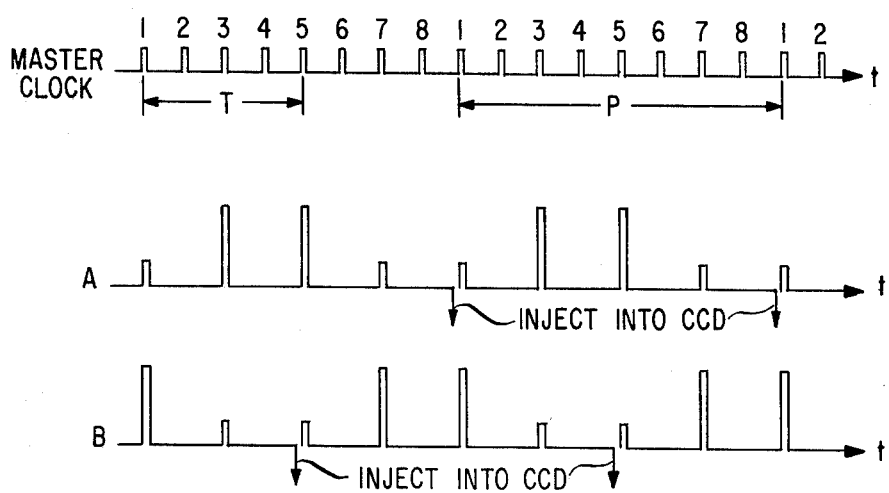
FIG. 2 is a plot of time slots, useful for describing operations in the apparatus shown in FIG. 1.
Figure 3:
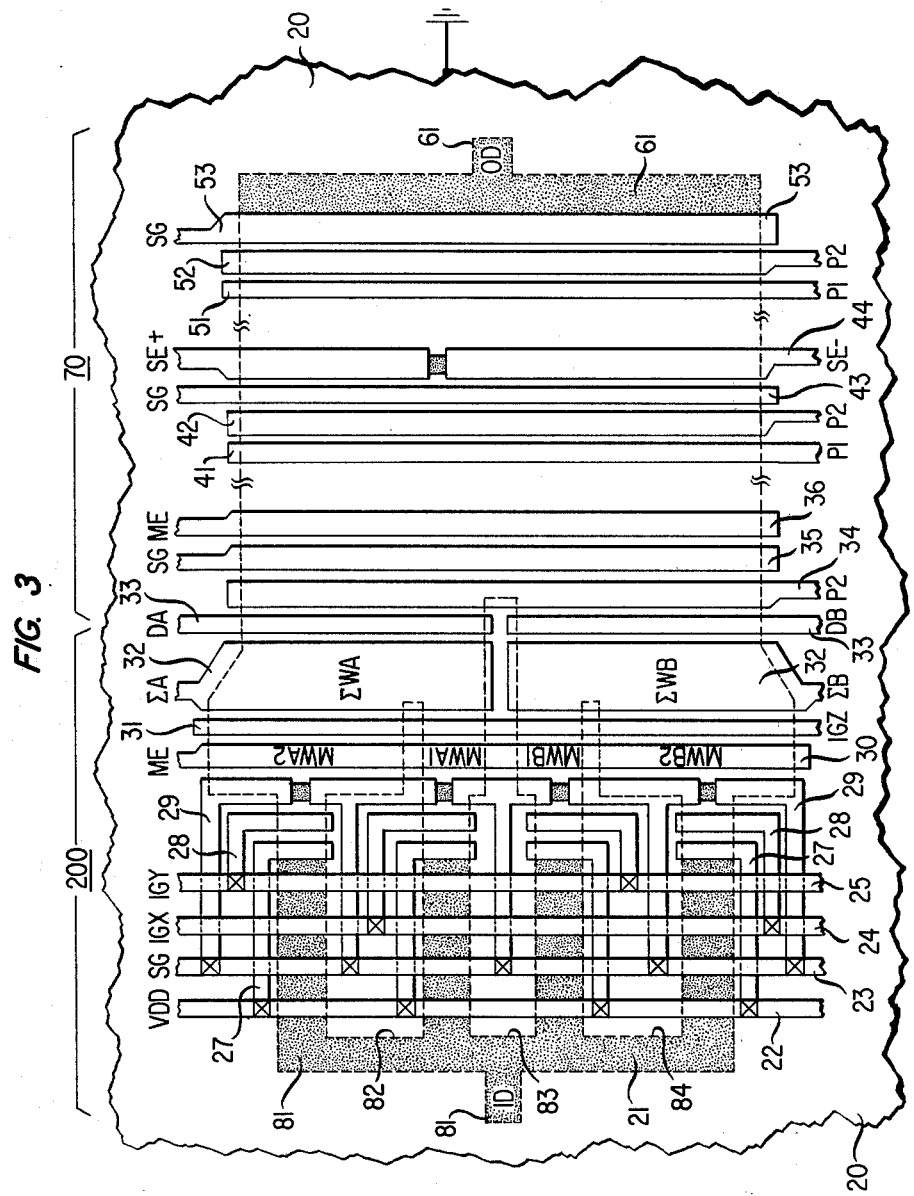
FIG. 3 is a top view diagram of a semiconductor device implementing the embodiment shown in FIG. 1.

FIG. 3 shows a top view of one form of a semiconductor pre-filter device useful for carrying out the charge packet processing previously described in conjunction with FIGS. 1 and 2. A monocrystalline silicon semiconductor substrate 20, typically of P type conductivity, supports a CCD 70 and a pre-filter device 200. This CCD 70 serves the same function as the CCD 17 of FIG. 1, and is of the split-electrode transversal filter configuration by way of illustration only. An N+ diffused region 61 (diffused regions indicated by stippling in FIG. 3) serves as the charge sink for the charge packets after their transfer through the CCD, as known in the art. An N+ diffused region 21 serves as an input diode region for producing charge packets, as explained in greater detail below.

There are three levels of "metallization" in the device shown in FIG. 3. The first level (closest approach of typically about 80 angstroms to the top surface of the semiconductor) of metallization includes electrodes 28, 30, 32, 34, 36,...42, 44...52. The second level of metallization (closest approach of typically about 900 angstrom) includes electrodes 27, 29, 31, 33, 35...41, 43,...51, 53. The third level of metallization (closest approach of typically about 10,000 angstrom) includes interconnection busses 22, 23, 24, and 25. Typically, the first and second levels of metallization are made of electrically conductive polycrystalline silicon (with next neighboring electrodes overlapping, but not shown for purpose of clarity in the drawing); whereas the third level of metallization is made of metal, typically of aluminum. All electrodes are insulated from the top surface of the semiconductor and from one another by an insulating layer, typically silicon dioxide, as known in the art. As indicated by the dotted lines, the top surface of the semiconductor is coated with thin oxide in the region between the dotted line 81 and the dotted lines 82, 83, 84, and with thick oxide elsewhere. Thus, thick oxide is present within the closed regions formed by the contours of the dotted lines 82, 83, and 84; therefore, as known in the art, the surface potentials in these thick oxide regions present a barrier to charge carriers and prevent charge packet transfers through these regions. Accordingly, there are four thin oxide regions underneath the electrode 30, each separated from its neighbor(s) by a thick oxide region(s); and these four thin oxide regions under electrode 30 serve as weighted metering wells (MWA1, MWA2, MWB2, MWB1) for the pre-filter 200 corresponding to the metering wells 11, 12, 13, 14 of the pre-filter 100 (FIG. 1). It should be noted that there is ordinarily present a diffused N+ region in all thin oxide regions that are not covered by polysilicon, such as between each of the two electrodes 44(SE+ and SE−) forming a split electrode configuration, produced by virtue of the diffusion step for N+ diffused regions 21 and 61, but this does not materially affect the operation.

The electrodes 27 are four in number; each is L-shaped and is contacted by the interconnection bus 22 through a different contact window in the oxide, each as indicated by a cross X mark in FIG. 3. These electrodes 27 are maintained at a constant potential VDD, typically about 12 volt, to shield the input diode from pulses of IGX and IGY. The electrodes 28 are also four in number; each is L-shaped; two of them are contacted by the bus 24 and two of them by the bus 25, through different contact windows in the oxide. These electrodes 28 are controlled by voltage pulses supplied through buses 24 and 25, in order to enable charge packet transfer across the underlying semiconductor regions during time slots (1, 7) or (3, 5) as the case may be, these time slots being determined with reference to the corresponding slots for switches (1, 7) or (3, 5), respectively, in the device 100 of FIG. 1 as previously described.

Figure 4:
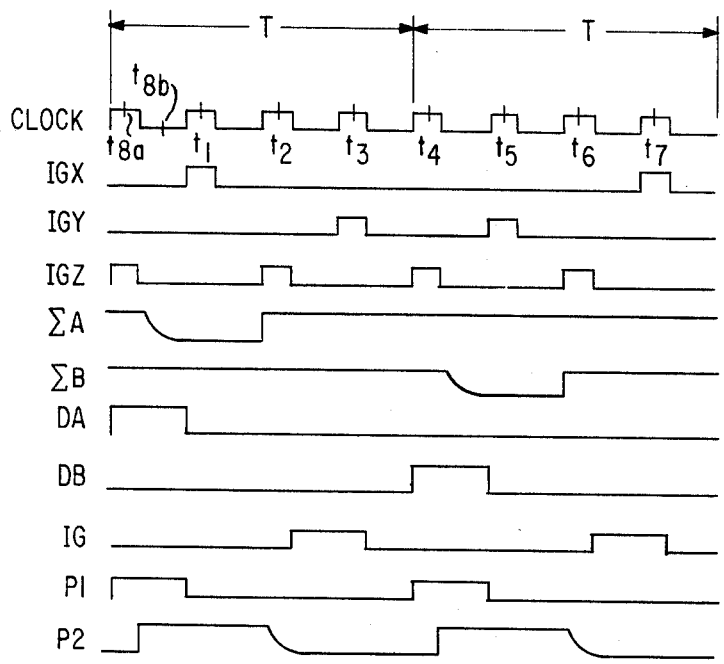
FIG. 4 is a plot of various voltages vs. time, useful for describing operation of the device shown in FIG. 3.
Figure 5:
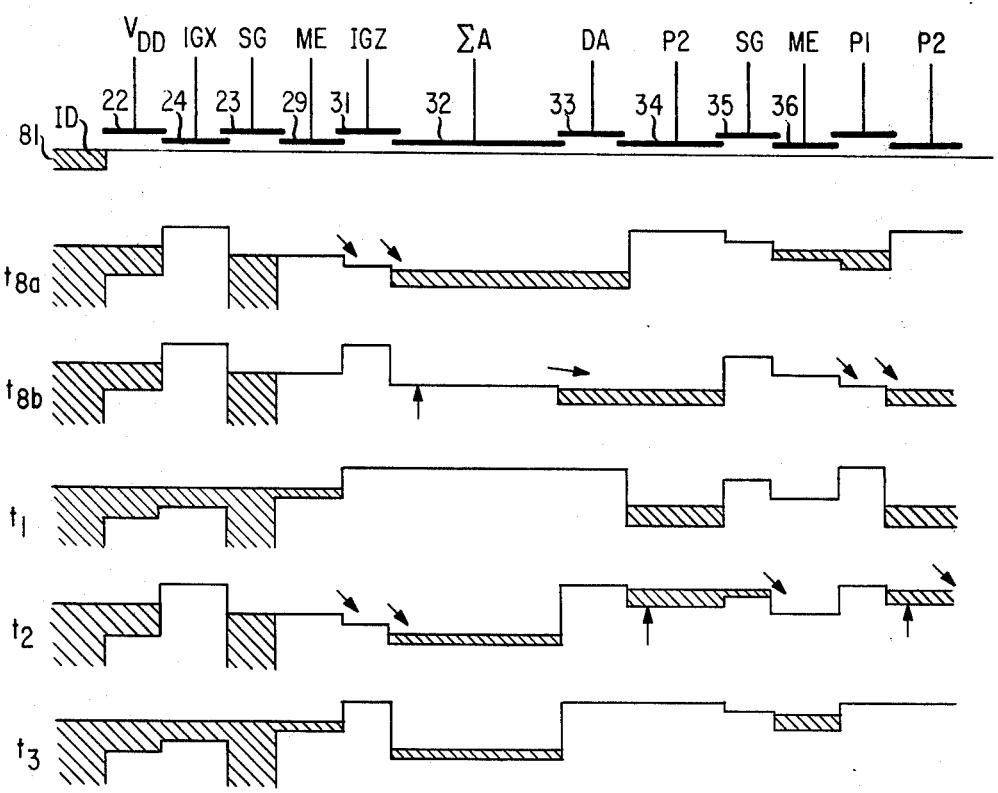
FIG. 5 is a diagram (not to scale for the sake of clarity only) of a typical charge packet path along a portion of the device shown in FIG. 3.

In order to describe the operation of the prefilter device 200 in conjunction with the CCD 70 in FIG. 3, it is convenient to refer to the applied voltage sequences shown in FIG. 4 and the sequence of charge packet transfers along a typical path through the devices 200 and 70 is shown in FIG. 5 (taken at times $t_{8a}$, $t_{8b}$, $t_1$, $t_2$, and $t_3$ indicated in the "clock" sequence of FIG. 4). A table of typical approximate applied voltages is given by (substrate 20 being considered as at 0 volt):

ID = 9v (+2v signal)
VDD = 17v
IGX = 5v passive, 13 volt active phase
SG = 7v
ME = 11v
IGZ = 5v passive, 13 volt active phase
EA(=EB) = 5v passive, 17 volt active phase
DA(=DB) = 5v passive, 17 volt active phase
P2 = 5v passive, 17 volt active phase
P1 = 5v passive, 13 volt active phase.

The 13 volt upper limit of P1 relative to the 17 volt limit of P2 is selected for preventing backward transfer of signal charge to the diffused ("diode") region in the semiconductor underneath the split in the split electrode 44.

In any event, the voltages are adjusted so that when the signal sample from the input signal line is zero, then the charge packet metered out by the corresponding metering well is (at least approximately) one-half a "full bucket" of charge (i.e., midway between a "fat zero" charge packet and a maximum possible charge packet that can be metered out).

It should be understood that during operation, the shield gate (SG) electrodes serve as electrical shields; for example, electrode 43 serves to shield the split sense electrode 44 (SE+, SE−) from stray fields of the P2 voltage on electrode 42. As indicated by curve $t_1$ in FIG. 5, the voltage on the input diode (ID) region 81 controls the level of charge underneath electrodes 22, 24, 29, and 30 (VDD, IGX, SG, and ME) at $t_1$. This input diode voltage is obtained from the input signal line (such as by suitable sample and hold techniques). As indicated by curve $t_2$ in FIG. 5, the charges in the input diode are suddenly presented with a potential barrier due to termination of the pulse on IGX, thereby isolating the surface charges underneath the metering electrodes 30 (ME) and in the small diode region in the gap of SG from the input diode. Subsequently, these charges are transferred to the summing well ΣMA (controlled by voltage ΣA) underneath the electrode 32. The transfer to this summing well thus occurs at $t_2$ because of the pulse of IGZ on electrode 31 at that time (similar to operation during an earlier transfer at $t_{8a}$). Charge transfer from the summing well ΣWA into the first stage of the CCD 70 under electrode 34 occurs as indicated in the transactions from curve $t_{8a}$ to curve $t_1$ in FIG. 5, as controlled by the voltage DA on electrode 33. It should be understood that, subsequent to $t_3$ (and until $t_8$), further charge packets will be formed in accordance with the signal applied to the input diode (ID) and will be transferred by virtue of IGX and IGY into the various weighted metering wells MWA1, MWA2, MWB1, MWB2 and thence into the summing wells controlled by ΣA or ΣB, and finally into the first stage of the CCD 70 as controlled by DA or DB.

Figure 6:
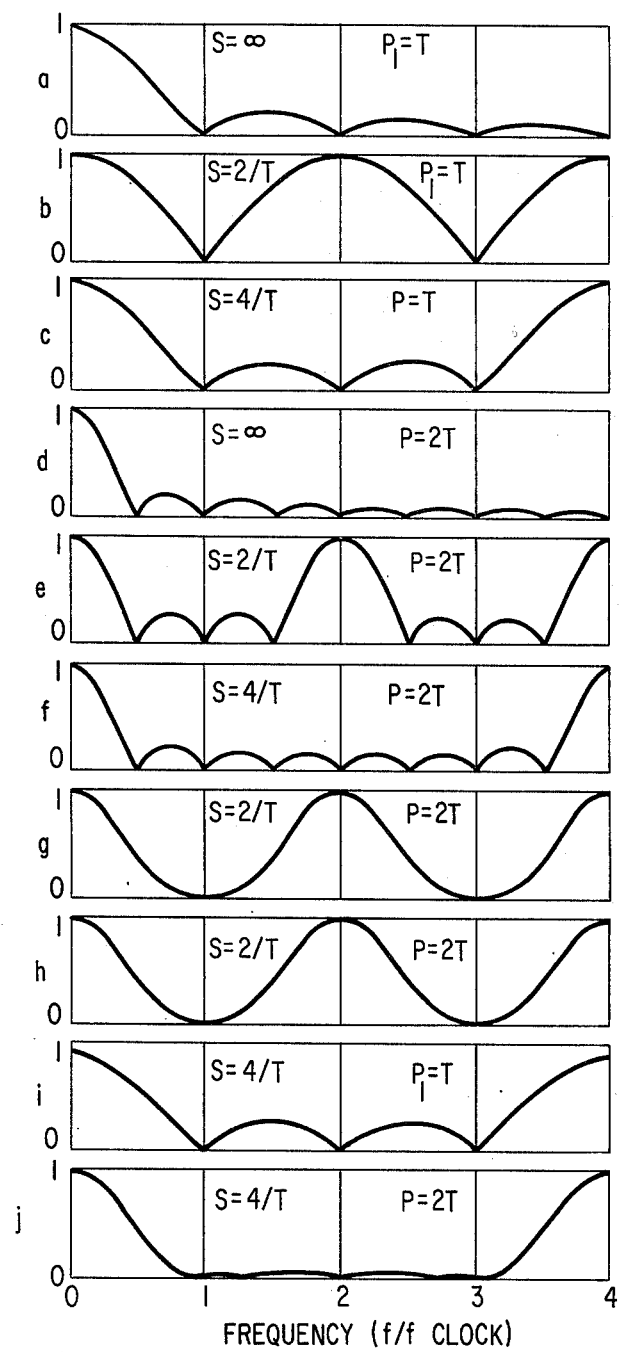
FIG. 6 is a series of plots of pass characteristics vs. frequency, useful for describing the features of operation of the invention.

FIG. 6 shows the predicted results of prefiltering using various rates and types of sampling of an input signal, followed by integrating the sample. In curve a of FIG. 6, the sampling rate is infinite, that is, infinitely many samples are taken per unit time; while the integrating time interval $P_1$ (summing or averaging period) is just one full clock period T of the CCD, that is, the pre-filter averages the input signal over just one full CCD clock cycle period T. The resulting frequency pass response of the pre-filter, that is, relative pre-filter pass characteristic vs. frequency, is of the form $\sin(\pi fT)/\pi fT$. Curve b in FIG. 6 shows the resulting pass characteristic for the case of just two individual (equi-spaced in time) samples taken per clock period T and summed together over said T, each sample being taken during a very narrow time slot (δ-function) compared with T. Thus the sampling rate $S = 2/T$, and the averaging interval $P_1 = T$, for this curve b. Similarly, curve c in FIG. 6 shows the resulting characteristic for just four such samples per clock period T, i.e., $S = 4/T$, again with $P_1 = T$. Curves a, b, and c indicate poor anti-aliasing pre-filter characteristics: specifically, the "zero" in the frequency response at $f/f_{clock} = fT = 1$ is a "first order zero"; so that, in the important frequency neighborhood of $f = f_{clock}$, the characteristic response undesirably deviates linearly from zero as f varies away from $f_{clock}$. This characteristic gives rise to a correspondingly undesirably large amount of pass characteristic of the pre-filter in the neighborhood of $f = f_{clock}$. Curve d in FIG. 6 shows the effect of increasing the averaging period P, which is here extended to P=2T with infinite sampling rate (S= ∞); whereas curves e and f show the frequency response with S=2/T and S=4/T, respectively (i.e., 4 samples and 8 samples, respectively over each summing interval P=2T). These curves d, e, and f all use equal weights for all samples, and all these curves likewise are characterized by an undesirable linear deviation of response from zero for frequencies in the neighborhood of $f = f_{clock}$. Thus, curves d, e, and f show that the corresponding pre-filters are all characterized by poor anti-aliasing properties in this important frequency region. However, by assigning relative weights 1, 3, 3, 1 (normalized weights = ⅛, ⅜, ⅜, ⅛) to the four samples taken at rate S=2/T over each averaging period P=2T and integrating together the thus weighted samples, the frequency stopband characteristic, and hence the desired anti-aliasing effect, is markedly improved (by virtue of a higher order "zero", a triple zero) as shown in curve g of FIG. 6. Thus, curve g shows the improved anti-aliasing results for the above-described specific embodiment. Curve h in FIG. 6 shows the response for the similar case as curve g except that "optimal" weights 0.115, 0.328, 0.328, 0.115 are used in obtaining curve h, these weights being calculated from the Remez algorithm, to minimize the maximum possible errors in the passband and in the stopband. See, for examples of this Remez algorithm: J. H. McClellan et al., "A Computer Program for Designating Optimum FIR Linear Phase Digital Filters", IEEE Transactions on Audio and Electroacoustics, Vol. AU-21, pp. 506–526 (1973). Even using these optimally weighted samples, it is still important to use an averaging interval P=2T (or more) rather than $P_1 = T$. This is seen in part from curve t which, although using four optimally weighted samples, is characterized by poor anti-aliasing because it uses an averaging interval $P_1 = T$; and from curve j, which uses an averaging interval P=2T with eight optimally weighted samples and is characterized by a good anti-aliasing property. The resulting maximum signal amplitude errors over the stophand 28 to 36 kHz and passband 0 to 4 kHz for curves g, h, i, and j, respectively, are 5.3%, 2.7%, 12.4%, and 2.3%. It is thus evident that the extension of the averaging interval to 2T is more important than increasing the sampling rate to S=4/T or than using optimally weighted samples (0.115, 0.328, 0.328, 0.115) rather than non-optimally weighted samples (1, 3, 3, 1).

Figure 7:
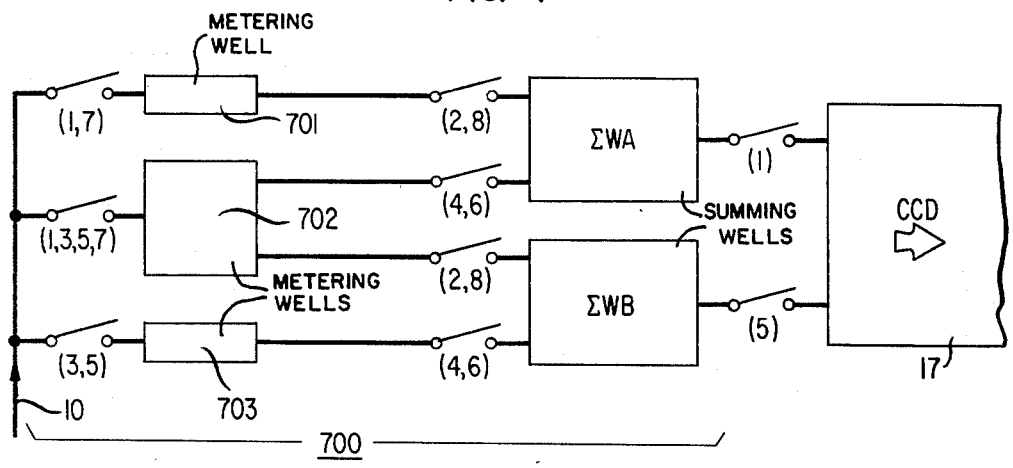
FIG. 7 is a block diagram of a pre-filter apparatus in accordance with another specific embodiment of the invention.

FIG. 7 shows a pre-filter device 700 in accordance with another embodiment of the invention. In the pre-filter device 700, only three metering wells 701, 702, and 703 (weighted in area: 1, 3, 1) are reqired for the same prefilter characteristics as the four metering wells of the pre-filter device 100 (FIG. 1). Again, S = 2/T and P = 2T. The resulting economy of space of the device 700 on the semiconductor chip is made possible by using the middle metering well 702 as a source of charge packets for both summing wells ΣWA and ΣWB alternatingly in time, in accordance with the sequence of closures of the switches indicated by the number(s) in the parentheses adjacent to the respective switches in FIG. 7.

Figure 8:
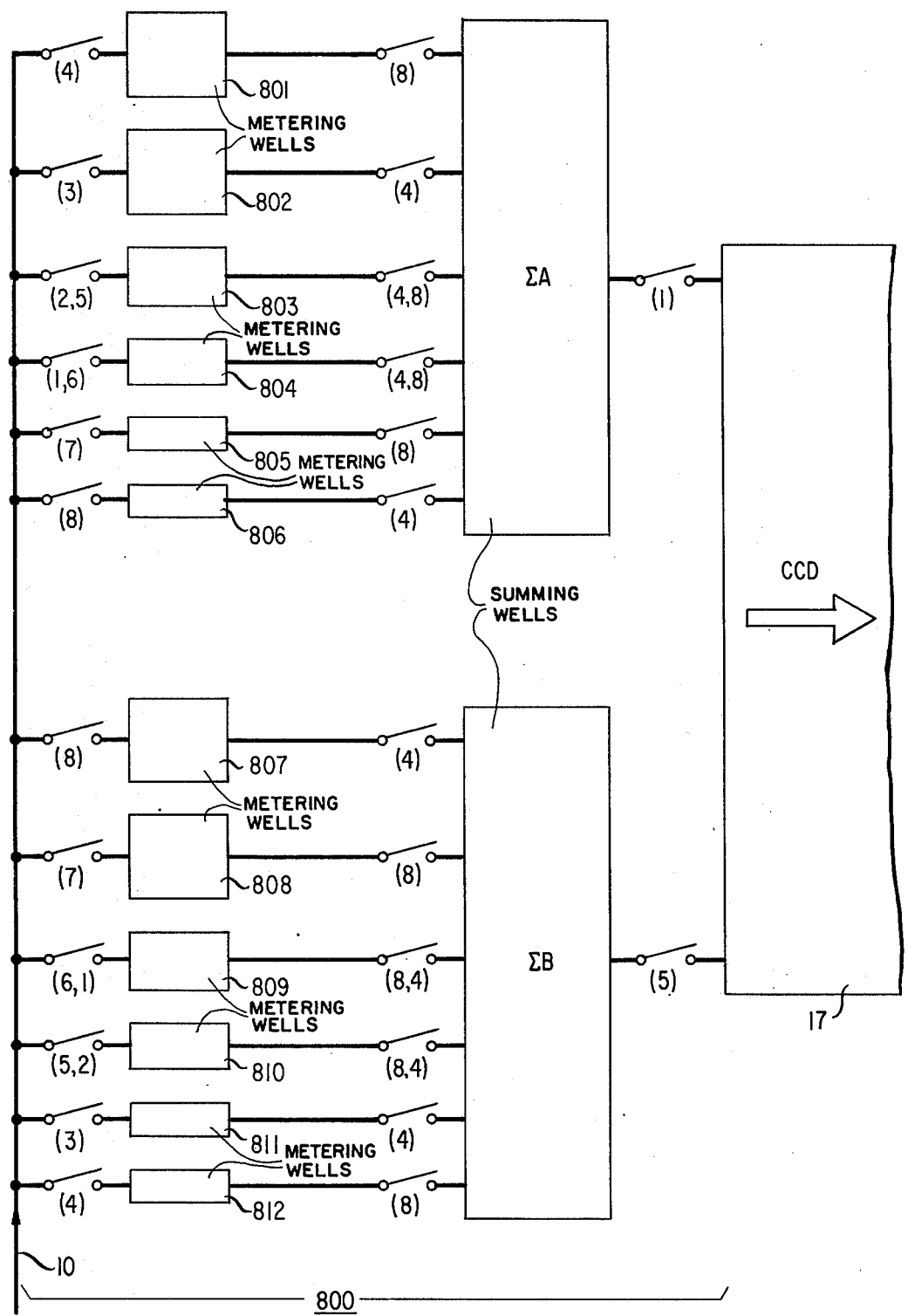
FIG. 8 is a block diagram of a pre-filter apparatus in accordance with yet another specific embodiment of the invention.

FIG. 8 shows a pre-filter device 800 in accordance with yet another embodiment of the invention. In the pre-filter device 800, the sampling rate S = 4/T, that is, twice the sampling rate 2/T of the pre-filter devices 100 (FIG. 1) and 700 (FIG. 7); and the averaging period P = 2T, just as in the devices 100 (FIG. 1) and 700 (FIG. 7). This higher sampling rate S=4/T is made possible by the use of six metering wells in each of two branches.

Branch A contains metering wells 801, 802, 803, 804, 805, and 806 (weighted in area: 2.34, 2.34, 1.64, 0.97, 0.15, 0.15); branch B contains metering wells 807, 808, 809, 810, 811 and 812 (similarly weighted). In this way, as seen from curve *j* in FIG. 6 (as contrasted with curves *g* and *h*), the pre-filter device 800 also suppresses aliasing centered frequency $f = 2f_{clock}$, which is a desirable feature in that it relaxes the requirements on any RC filter (or other type of additional low pass filter) which would still be required to suppress any aliasing caused by frequencies in the neighborhood centered at $f = 4f_{clock}$ (and still higher aliasing frequencies: still higher integral multiples of $4\, f_{clock}$). By contrast, the aliasing centered at $f = 2\, f_{clock}$ (and integral multiples of $2\, f_{clock}$) would have to be suppressed by a somewhat more costly additional RC type filter (or other additional low pass filter), in case such undesired signals in the neighborhood $2 f_{clock}$ (and integral multiples thereof) are present on the input signal line. Thus, for the case of $f_{clock} =$ kHz, aliasing in the frequency range of 60 to 68kHz will be suppressed by the device 800, so that the additional RC type filter need only suppress frequencies above 124 kHz ($=$ 128kHz$-$4kHz).

Figure 9:
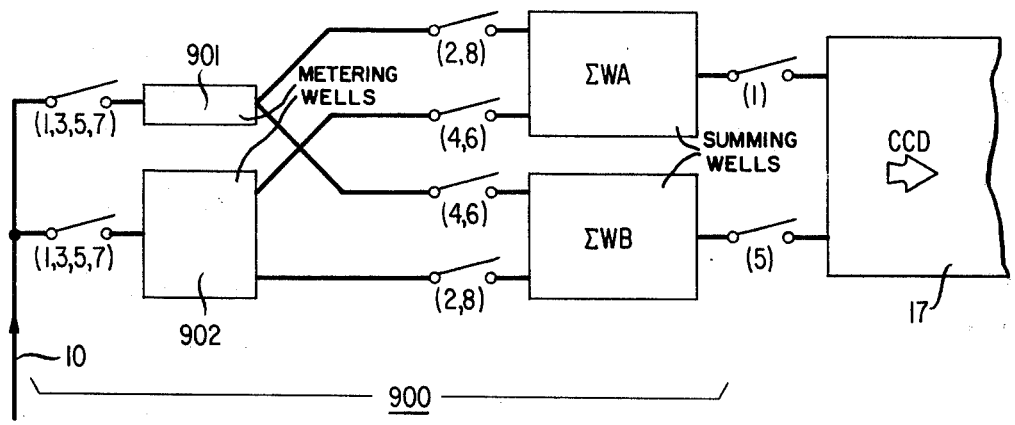
FIG. 9 is a block diagram of a pre-filter apparatus in accordance with yet another specific embodiment of the invention.

FIG. 9 shows another specific embodiment of the invention. Here a prefilter device 900 is characterized by a sampling rate of S $=$ 2/T and period P$=$2T, and is similar to the above described pre-filter devices 100 and 700, except that further economy of space is achieved by using only two metering wells 901 and 902 (weighted areas: 1, 3) each alternatively feeding summing wells ΣWA and ΣWB. However, crossover type of switching interconnections are required in this pre-filter device 900, so that it is more adapted for use in conjunction with discrete electrical capacitor storage elements with suitably timed switches rather than in conjunction with devices using semiconductor charge packets. The use of such discrete capacitor storage elements is disclosed in a copending patent application Ser. No. 588,012 filed by R. L. Carbrey (case 52) on June 18, 1975.

Although the invention has been described in detail in terms of a specific embodiment, various modifications can be made without departing from the scope of the invention. For example, more than two parallel branches than just A and B described above can be used in conjunction with suitable multiple interleaving in time of the output of the multiple branches into the CCD. Moreover, instead of the semiconductor pre-filter in conjunction with a CCD transversal filter, other types of charge transfer device filters and delay lines, as well as other more general types, of delay lines can be used which utilize sampled data inputs to the delay line. For example, instead of the conversion of signal samples into charge packets in the semiconductor pre-filters 100, 700, and 800 as described above, the apparatus including a multiplicity of capacitor storage elements as described in the aforementioned copending patent application Ser. No. 588,012 (Robert L. Carbrey - 52) can be used in conjunction with corresponding modifications in the relative sizes of capacitors, that is, the capacitors being proportional to the weighting factors described above.

As an alternative to using the different areas for the different metering wells for the purpose of obtaining prescribed weighting factors, other geometrical parameters can also be made different in the metering wells such as distance of metering electrode to semiconductor surface.

The use of two parallel branches A and B (two summing wells) instead of just one branch (one summing well) in a single branch in the case of P$=$2T enables use of the full data handling capacity of the CCD; however, the anti-aliasing effect can still be achieved with only one branch, but at the sacrifice of the data handling rate of the CCD, and hence at some sacrifice of the desired CCD lowpass filtering characteristics. Thus the use of more than one branch is desirable.

What is claimed is:

1. Semiconductor apparatus comprising:
   a. time determining means for producing first and second activating signals at predetermined at least first and second difference times;
   b. input means, responsive to an electrical input signal, for generating charges in a semiconductor body in accordance with said input signal;
   c. switching means, responsive to said activating signals, for enabling the flow of first and second amounts of said charges, respectively, developed in said input means in accordance with first and second signal samples taken of the said electrical signal at said first and second times, respectively;
   d. first semiconductor potential well means including a first region in the semiconductor body, responsive to said input means, for receiving said first amount of charges from said input means and for producing a first charge packet of charge content in a first proportion to the said first signal sample;
   e. second semiconductor potential well means including a second region in said semiconductor body, responsive to said input means, for receiving said second amount of charges from the input means and for producing a second charge packet of charge content in a second, different proportion to the said second signal sample;
   f. third semiconductor potential well means including a third region in said semiconductor body, responsive to said first and second means, for receiving said first and second charge packets at third and fourth times and for summing together said first and second charge packets, to form a third charge packet of charge content equal at least to the sum of the charge contents of said first and second charge packets; and
   g. fourth means for delivering said third packet to a fourth region in said body at a fifth time; said first, second, third, and fourth regions being integrated in a single semiconductor substrate.

2. Apparatus according to claim 1 in which said first, second, third, fourth, and fifth times are within a predetermined periodic time interval, whereby a different third packet is formed during each said periodic time interval in proportion to at least the sum of the charge contents of the first charge packet and the second charge packet produced during each said periodic time interval, said fourth region being an input region for a semiconductor charge transfer device integrated in said substrate.

3. Semiconductor apparatus according to claim 1 in which said third and fourth times are different.

4. Apparatus according to claim 2 which further comprises:
   a. sixth semiconductor potential well means for producing a sixth charge packet of charge content in a sixth proportion to a sixth signal sample taken of said input signal at a sixth time;

b. seventh semiconductor potential well means for producing a seventh charge packet of charge content in a seventh proportion, different from the sixth proportion, to a sixth signal sample taken of said input signal at a seventh time different from the sixth time;

c. eighth semiconductor potential well means, responsive to said sixth and seventh means, for receiving said sixth and seventh charge packets at eighth and ninth times and for summing together said sixth and seventh charge packets, to form an eighth charge packet of charge content equal to the sum of said sixth and seventh packets; and d. ninth semiconductor potential well means, responsive to said eighth means, for delivering said eighth charge packet to said semiconductor charge transfer device at a tenth time; said sixth, seventh, eighth, and ninth means being integrated in the said semiconductor substrate; said tenth time being different from said fifth time.

5. Apparatus according to claim 4 in which said sixth proportion is the same as said second proportion, and in which said seventh proportion is the same as said first proportion, said sixth time being the same as said first time, and said seventh time being the same as said second time.

6. Semiconductor apparatus comprising:
a. time slot determining means for producing first and second activating signals during at least first, second, third, and fourth mutually different time slots during each time interval of a first periodic sequence of time intervals;

b. input means, responsive to an electrical input signal, for generating charges in a semiconductor body in accordance with said input signal;

c. switching means, responsive to said activating signals, for enabling the flow of first, second, third, and fourth amounts of said charges, respectively, developed in said input means in accordance with first, second, third, and fourth signal samples taken of said electrical input signal during said first, second, third, and fourth time slots, respectively, during each corresponding time interval from said input means;

d. first semiconductor potential well means, responsive to said input means, including a first semiconductor region for receiving said first and fourth amounts of charges from said input means and for developing at least first and fourth charge packets in said first semiconductor region during each time interval of a first periodic sequence of time intervals, said first and fourth packets having charge contents respectively in accordance with a first weighting factor with respect to said first and fourth samples;

e. second semiconductor potential well means, responsive to said input means, including a second semiconductor region for receiving said second and third amounts of charge from said input means and for developing at least second and third charge packets in said second semiconductor region during each said time interval, said second and third packets having charge contents respectively in accordance with a second different weighting factor with respect to said second and third samples;

f. third means, including a third semiconductor region, responsive to said first and second means, for receiving in said third region, at fifth and sixth different time slots during each said corresponding time interval, respectively, said first and fourth charge packets from said first semiconductor region, and for receiving in said third region said second and third charge packets during each said corresponding time interval from said second semiconductor region, and for summing together in said third region said first, second, third, and fourth charge packets to form a fifth charge packet, during each said corresponding time interval, of charge content equal to at least the sum of the charge contents of said first, second, third, and fourth charge packets; and g. fourth means, responsive to said third means, for delivering to a charge transfer fourth region said fifth packet at a seventh time slot during each said corresponding time interval; said first, second, third, and fourth regions being located in a single semiconductor body.

7. Apparatus according to claim 6 which further includes:
a. fifth means, including a fifth semiconductor region, for developing at least sixth and seventh charge packets in said fifth region during each time interval of a second different periodic sequence interlaced with said first sequence, all time intervals of the first and second sequences being of mutually equal duration, said sixth and seventh packets having charge contents in accordance with said second weighting factor with respect to respective samples taken of said input signal at different respective eighth and ninth time slots during each said corresponding time interval of the second periodic sequence;

b. sixth means, including a sixth semiconductor region, for developing at least eighth and ninth charge packets in said sixth region during each time interval of said second periodic sequence, said eighth and ninth packets having charge contents in accordance with said first weighting factor with respect to respective samples taken of said input signal at different respective tenth and eleventh time slots, mutually different from the eighth and ninth time slots, during each said corresponding time interval of the second sequence;

c. seventh means, including a seventh semiconductor region, responsive to said fifth and sixth means, for receiving in said seventh region at tenth and eleventh different time slots during each said corresponding time interval of the second sequence respectively said sixth and seventh packets, and for receiving in said seventh region said eighth and ninth packets during each said corresponding time interval from said seventh region, and for summing together in said seventh region said sixth, seventh, eighth, and ninth charge packets to form a tenth charge packet during each said corresponding time interval of the second sequence of charge content equal to at least the sum of the charge contents of said sixth, seventh, eighth, and ninth packets; and d. eighth means for delivering said tenth packet to said fourth region at a different time slot from said seventh time slot.

8. Semiconductor apparatus comprising:
a. first means including a first semiconductor region for developing first and second charge packets in said first semiconductor region during each time interval of a first periodic sequence of time interval, said first and second packets having charge contents respectively in accordance with a first weighting factor with respect to first and second samples taken of an input signal at respectively first and second different time slots during each corresponding said time interval;

b. second means including a second semiconductor region for developing third and fourth charge packets in said second semiconductor region during each said time interval, said third and fourth packets having charge contents respectively in accordance with a second different weighting factor with respect to third and fourth samples taken of said input signal at respectively third and fourth different time slots during each said corresponding time interval;

c. third means, including a third semiconductor region, responsive to said first and second means, for receiving in said third region, at fifth and sixth different time slots during each said corresponding time interval, respectively, said first and second charge packets from said first semiconductor region, and for receiving in said third region said third and fourth charge packets during each said corresponding time interval from said second semiconductor region, and for summing together in said third region said first, second, third, and fourth charge packets to form a fifth charge packet, during each said corresponding time interval, of charge content equal to the sum of the charge contents of said first, second, third, and fourth charge packets; and d. fourth means, responsive to said third means, for delivering to a charge transfer fourth region said fifth packet at a seventh time slot during each said corresponding time interval; said first, second, third and fourth regions being located in a single semiconductor body.

9. Semiconductor apparatus according to claim 8 comprising:

a. fifth means, including a fifth semiconductor region, for developing sixth and seventh charge packets in said fifth region during each time interval of a second different periodic sequence interlaced with said first sequence, all time intervals of the first and second sequences being of mutually equal duration, said sixth and seventh packets having charge contents in accordance with said second weighting factor with respect to respective samples taken of said input signal at different respective eighth and ninth time slots during each said corresponding time interval of the second periodic sequence;

b. sixth means, including a sixth semiconductor region, for developing eighth and ninth charge packets in said sixth region during each time interval of said second periodic sequence, said eighth and ninth packets having charge contents in accordance with said first weighting factor with respect to respective samples taken of said input signal at different respective tenth and eleventh time slots, mutually different from the eighth and ninth time slots, during each said corresponding time interval of the second sequence;

c. seventh means, including a seventh semiconductor region, responsive to said fifth and sixth means, for receiving in said seventh region at tenth and eleventh different time slots during each said corresponding time interval of the second sequence respectively said sixth and seventh packets, and for receiving in said seventh region said eighth and ninth packets during each said corresponding time interval from said seventh region, and for summing together in said seventh region said sixth, seventh, eighth, and ninth charge packets to form a tenth charge packet during each said corresponding time interval of the second sequence of charge content equal to the sum of the charge contents of said sixth, seventh, eighth, and ninth packets; and d. eighth means for delivering said tenth packet to said fourth region at a different time slot from said seventh time slot.

10. Semiconductor apparatus according to claim 9 in which said first and second weighting factors are in a ratio of about three, and in which each time interval of the first sequence overlaps in time an interval of the second sequence by about one-half the duration of such an interval of the second sequence.

11. Apparatus according to claim 7 in which said first, second, and third semiconductor regions are surface regions defined by surface potential well.

* * * * *